US009506142B2

United States Patent
Sasai et al.

(10) Patent No.: US 9,506,142 B2
(45) Date of Patent: Nov. 29, 2016

(54) HIGH DENSITY MICROWAVE PLASMA GENERATION APPARATUS, AND MAGNETRON SPUTTERING DEPOSITION SYSTEM USING THE SAME

(71) Applicants: TOKAI RUBBER INDUSTRIES, LTD., Komaki-shi, Aichi-ken (JP); NAT'L UNIVERSITY CORPORATION NAGOYA UNIVERSITY, Nagoya-shi, Aichi-ken (JP)

(72) Inventors: Kensuke Sasai, Komaki (JP); Hirotaka Toyoda, Nagoya (JP)

(73) Assignees: SUMITOMO RIKO COMPANY LIMITED, Komaki-shi (JP); NATIONAL UNIVERSITY CORPORATION NAGOYA UNIVERSITY, Nagoya-shi (JP)

( * ) Notice: Subject to any disclaimer, the term of this patent is extended or adjusted under 35 U.S.C. 154(b) by 532 days.

(21) Appl. No.: 13/913,643

(22) Filed: Jun. 10, 2013

(65) Prior Publication Data

US 2013/0270110 A1 Oct. 17, 2013

Related U.S. Application Data

(63) Continuation of application No. PCT/JP2012/061049, filed on Apr. 25, 2012.

(30) Foreign Application Priority Data

Apr. 28, 2011 (JP) .................................. 2011-100736
Nov. 18, 2011 (JP) .................................. 2011-252383

(51) Int. Cl.
*C23C 14/35* (2006.01)
*H05H 1/46* (2006.01)
(Continued)

(52) U.S. Cl.
CPC ........... *C23C 14/357* (2013.01); *C23C 14/086* (2013.01); *H01J 37/32229* (2013.01); *H01J 37/32678* (2013.01); *H01J 37/3405* (2013.01); *H05H 1/46* (2013.01)

(58) Field of Classification Search
CPC .... H05H 1/46; C23C 14/357; C23C 14/086; H01J 37/32229; H01J 37/3405; H01J 37/32678; H01J 37/3222
See application file for complete search history.

(56) References Cited

U.S. PATENT DOCUMENTS

| 4,610,770 A | 9/1986 | Saito et al. | |
| 4,987,346 A * | 1/1991 | Katzschner | H01J 37/08 118/723 FI |

(Continued)

FOREIGN PATENT DOCUMENTS

| CN | 101127413 A | 2/2008 |
| JP | 04-181646 A | 6/1992 |

(Continued)

OTHER PUBLICATIONS

International Preliminary Report on Patentability (Form PCT/IB/373) of International Application No. PCT/JP2012/061049 dated Oct. 29, 2013, with Form PCT/ISA/237.

(Continued)

*Primary Examiner* — Michael Band
(74) *Attorney, Agent, or Firm* — Westerman, Hattori, Daniels & Adrian, LLP (57) ABSTRACT

A microwave plasma generation apparatus (4) includes: a rectangular waveguide (41) that transmits a microwave; a slot antenna (42) that has a slot (420) through which the microwave passes; and a dielectric portion (43) that is arranged so as to cover the slot (420) and of which a plasma generating region-side front face is parallel to an incident direction in which the microwave enters from the slot (420). The microwave plasma generation apparatus (4) is able to generate microwave plasma (P1) under a low pressure of lower than or equal to 1 Pa. A magnetron sputtering deposition system (1) includes the microwave plasma generation apparatus (4), and carries out film deposition using magnetron plasma (P2) while radiating microwave plasma (P1) between a base material (20) and a target (30). With the magnetron sputtering deposition system (1), it is possible to form a thin film having small asperities on its surface.

14 Claims, 6 Drawing Sheets

(51) Int. Cl.
*H01J 37/32* (2006.01)
*H01J 37/34* (2006.01)
*C23C 14/08* (2006.01)

(56) References Cited

U.S. PATENT DOCUMENTS

| | | | |
|---|---|---|---|
| 5,134,965 A * | 8/1992 | Tokuda | C23C 16/45502 |
| | | | 118/715 |
| 5,359,177 A | 10/1994 | Taki et al. | |
| 5,538,699 A | 7/1996 | Suzuki | |
| 6,158,383 A | 12/2000 | Watanabe et al. | |
| 6,497,783 B1 * | 12/2002 | Suzuki | H01J 37/32192 |
| | | | 156/345.1 |
| 6,652,709 B1 * | 11/2003 | Suzuki | H01J 37/32192 |
| | | | 118/723 MW |
| 8,610,353 B2 * | 12/2013 | Itoh | H01J 37/32192 |
| | | | 118/723 MW |
| 2003/0062519 A1 | 4/2003 | Yamazaki et al. | |
| 2004/0084305 A1 | 5/2004 | Fukuchi et al. | |
| 2006/0158381 A1 | 7/2006 | Ishii et al. | |
| 2007/0054064 A1 | 3/2007 | Ohmi et al. | |
| 2008/0099447 A1 | 5/2008 | Ando et al. | |
| 2010/0098955 A1 | 4/2010 | Sakakura | |
| 2011/0005461 A1 | 1/2011 | Vandermeulen | |
| 2014/0231244 A1 * | 8/2014 | Sasai | C23C 14/0676 |
| | | | 204/192.14 |

FOREIGN PATENT DOCUMENTS

| | | |
|---|---|---|
| JP | 05-345982 A | 12/1993 |
| JP | 06-057422 A | 3/1994 |
| JP | 06-116724 A | 4/1994 |
| JP | 07-006998 A | 1/1995 |
| JP | 8-62590 A | 3/1996 |
| JP | 10-34798 A | 2/1998 |
| JP | 10-512391 A | 11/1998 |
| JP | 11-77885 A | 3/1999 |
| JP | 2002-264245 A | 9/2002 |
| JP | 2003-115388 | 4/2003 |
| JP | 2003-301268 | 10/2003 |
| JP | 2003-301268 A | 10/2003 |
| JP | 2005-131863 | 5/2005 |
| JP | 2005119260 A | 5/2005 |
| JP | 2005-197371 | 7/2005 |
| JP | 2005-197371 A | 7/2005 |
| JP | 2005-243650 A | 9/2005 |
| JP | 2009-178956 | 8/2009 |
| JP | 2009-238474 A | 10/2009 |
| JP | 2009-277522 A | 11/2009 |
| JP | 2010-037656 A | 2/2010 |
| JP | 2010-080350 A | 4/2010 |
| WO | 96/21751 A1 | 7/1996 |
| WO | 2005/064660 A1 | 7/2005 |
| WO | 2008/117487 A1 | 10/2008 |

OTHER PUBLICATIONS

Chinese Office Action dated Dec. 31, 2015, issued in corresponding CN Patent Application No. 20128004136.9 with English translation (15 pages).
Chinese Office Action dated Dec. 31, 2014, issued in corresponding CN Patent Application No. 20128004136.9 with English translation (15 pages).
International Search Report for PCT/JP2012/061049, Mailing Date of Jul. 10, 2012.
Written Opinion for PCT/JP2012/061049, Mailing Date of Jul. 10, 2012.
Chinese Office Action dated Jul. 27, 2015, issued in corresponding CN Patent Application No. 201280004136.9 with English translation (14 pages).
Japanese Office Action dated Sep. 29, 2015 issued in corresponding JP Patent Application No. 2011-252383, with English tranalation (3 pages).
Japanese Office Action dated Oct. 13, 2015 issued in Japanese patent application No. 2011252458 (Japanese counterpart of U.S. Appl. No. 14/263,456, filed Apr. 28, 2014) (7 pages).
Office Action dated Jan. 4, 2016 issued in U.S. Appl. No. 14/263,456. (10 pages).
Borges, J. et al., "AlNoxOy thin films deposited by DC reactive magnetron sputtering", Applied Surface Science, 257 (2010), pp. 1478-1483.
General Magnaplate Corp. Friction Calculator, http://frictioncalculator.com/surface-roughness; retrieved Dec. 28, 2015.
International Search Report dated Dec. 4, 2012 issued in International application No. PCT/JP2012/073702 (International stage of U.S. Appl. No. 14/263,456).
Office Action dated Jan. 5, 2016, issued in counterpart Chinese Application No. 201280004136.9, with English Translation ( 23 pages).

* cited by examiner

HIGH DENSITY MICROWAVE PLASMA GENERATION APPARATUS, AND MAGNETRON SPUTTERING DEPOSITION SYSTEM USING THE SAME

TECHNICAL FIELD

The present invention relates to a microwave plasma generation apparatus that is able to generate microwave plasma under low pressure, and a magnetron sputtering deposition system using the same.

BACKGROUND ART

A sputtering deposition method includes a diode sputtering method, a magnetron sputtering method, and the like. For example, in the diode sputtering method that utilizes radio frequency (RF), there is a problem that a deposition rate is low, and the temperature of a base material tends to increase due to irradiation of secondary electrons ejected from a target. Therefore, the RF diode sputtering method is not suitable for mass production. On the other hand, with the magnetron sputtering method, secondary electrons ejected from a target are captured by a magnetic field generated on the surface of the target. Therefore, the temperature of a base material is less prone to increase. In addition, ionization of gas is facilitated by captured secondary electrons, so it is possible to increase the deposition rate (for example, see Patent Document 1 and Patent Document 2).

RELATED ART DOCUMENTS

Patent Documents

Patent Document 1: Japanese Patent Application Publication No. 6-57422 (JP 6-57422 A)
Patent Document 2: Japanese Patent Application Publication No. 2010-37656 (JP 2010-37656 A)
Patent Document 3: Japanese Patent Application Publication No. 2005-197371 (JP 2005-197371 A)
Patent Document 4: Japanese Patent Application Publication No. 7-6998 (JP 7-6998 A)
Patent Document 5: Japanese Patent Application Publication No. 2003-301268 (JP 2003-301268 A)

SUMMARY OF THE INVENTION

Problem to be Solved by the Invention

Among magnetron sputtering methods, a direct-current (DC) magnetron sputtering method (including a DC pulse type) is widely used from the standpoint of deposition rate, or the like. However, the DC magnetron sputtering method has such inconvenience that plasma does not become stable or plasma is not generated unless certain high voltage is applied to a target. Therefore, usually, high voltage having several hundreds of volts is applied to the target. If the applied voltage is high, particles having a large particle diameter, such as cluster particles, may be ejected from the target. If the particles having a large particle diameter adhere to a base material, asperities are formed on the surface of a film formed. When the surface of the film has large asperities, oxygen, or the like, tends to be adsorbed to pits, which may degrade the film itself or a counterpart material that contacts the film. In addition counterpart material may be degraded due to projections.

The present invention is made in view of such a situation, and it is an object of the present invention to provide a magnetron sputtering deposition system that is able to form a thin film having small asperities on its surface, and a microwave plasma generation apparatus that is used in the deposition system and that is able to generate microwave plasma under low pressure.

Means for Solving the Problem (1) The inventors diligently conducted researches on film deposition with the use of a DC magnetron sputtering method and finally found that, when film deposition is carried out using plasma generated through magnetron discharge (hereinafter, referred to as "magnetron plasma" where appropriate) while microwave plasma is being radiated, it is possible to decrease an applied voltage and to achieve the above object. However, usually, magnetron sputtering is carried out under a certain low pressure at which magnetron plasma is stable in order to keep film quality by suppressing entry of impurities. The pressure at the time of film deposition is desirably about 0.5 to 1.0 Pa. Meanwhile, a general microwave plasma generation apparatus generates microwave plasma under a relatively high pressure of higher than or equal to 5 Pa (for example, see Patent Document 3). Therefore, if the existing microwave plasma generation apparatus is used, it is difficult to generate microwave plasma under a low pressure of lower than or equal to 1 Pa at which magnetron sputtering is carried out. This reason is understood as follows.

Figure 6:
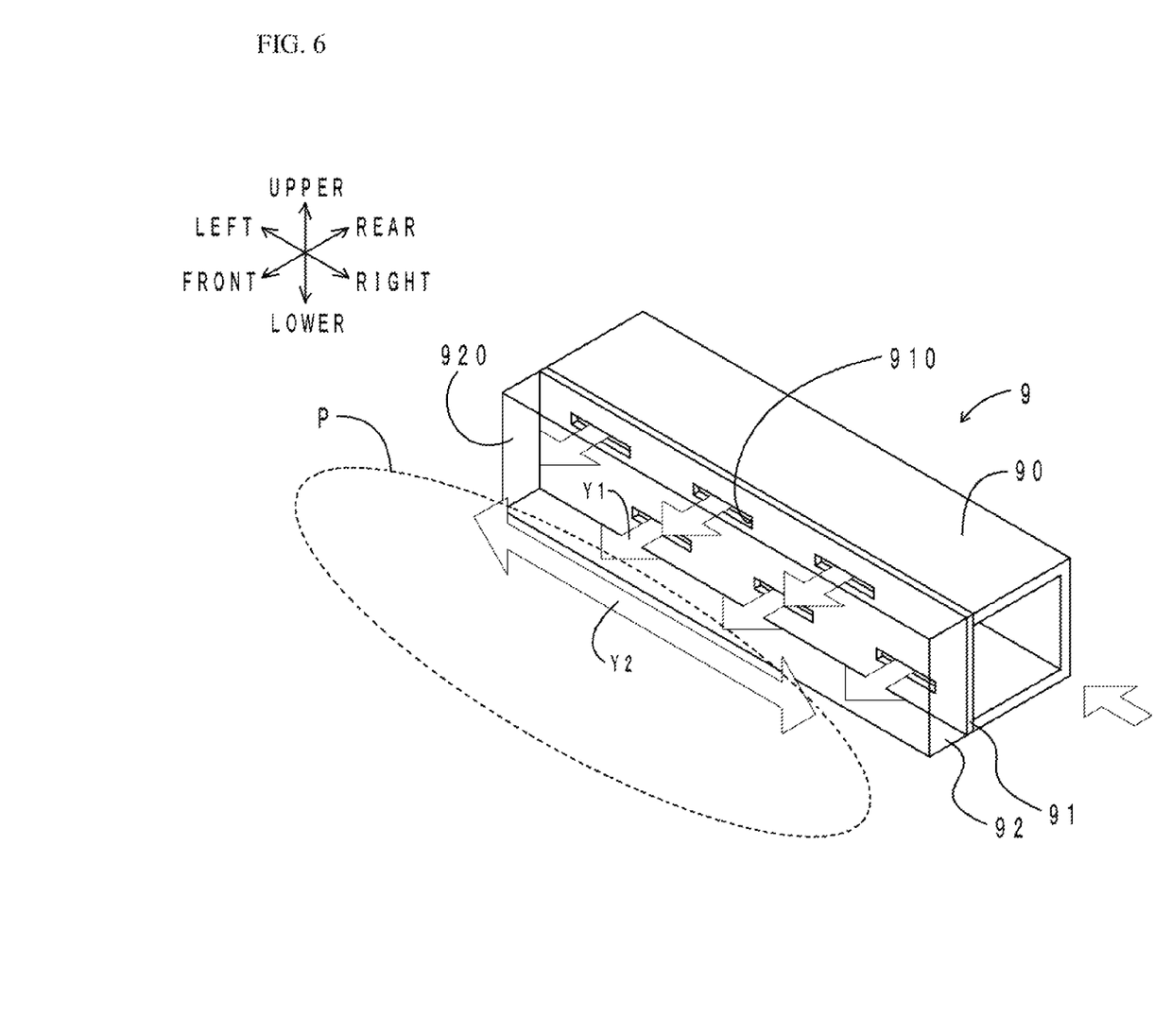
FIG. 6 is a perspective view of a plasma generating unit in an existing microwave plasma generation apparatus.

FIG. 6 shows a perspective view of a plasma generating unit in the existing microwave plasma generation apparatus. As shown in FIG. 6, the plasma generating unit 9 includes a waveguide 90, a slot antenna 91 and a dielectric portion 92. The slot antenna 91 is arranged so as to close the front opening of the waveguide 90. That is, the slot antenna 91 forms the front wall of the waveguide 90. A plurality of oblong hole-shaped slots 910 are formed in the slot antenna 91. The dielectric portion 92 is arranged on the front face (vacuum casing side) of the slot antenna 91 so as to cover the slots 910. A microwave transmitted from the rig lit end of the waveguide 90 passes through the slots 910 and enters the dielectric portion 92 as indicated by outlined arrows Y1 in the front-to-rear direction in the drawing. The microwave that has entered the dielectric portion 92 propagates along a front face 920 of the dielectric portion 92 as indicated by the outlined arrow Y2 in the lateral direction in the drawing. Thus, microwave plasma P is generated.

Here, the incident direction (arrows Y1) in which the microwave enters from the slots 910 to the dielectric portion 92 is perpendicular to the front face 920 of the dielectric portion 92. Therefore, the microwave that has entered the dielectric portion 92 is blocked by the generated microwave plasma P, changes its travel direction by 90°, and then propagates along the front face 920 of the dielectric portion 92 (arrow Y2). In this way, the microwave enters perpendicularly to the generated microwave plasma P, so the microwave that is a plasma source does not easily propagate over the microwave plasma P. Therefore, it is presumable that it is difficult to generate plasma under low pressure.

Then, the inventors focused attention on the incident direction in which the microwave enters the generated microwave plasma, and developed a microwave plasma generation apparatus that is able to generate microwave plasma even under a low pressure of lower than or equal to 1 Pa. That is, the microwave plasma generation apparatus according to the present invention is a microwave plasma generation apparatus that generates microwave plasma in a vacuum casing, and includes: a rectangular waveguide that transmits a microwave; a slot antenna that is arranged at one face of the rectangular waveguide and that has a slot through which the microwave passes; and a dielectric portion that is arranged so as to cover the slot of the slot antenna, and of which a plasma generating region-side front face is parallel to an incident direction in which the microwave enters from the slot.

Figure 3:
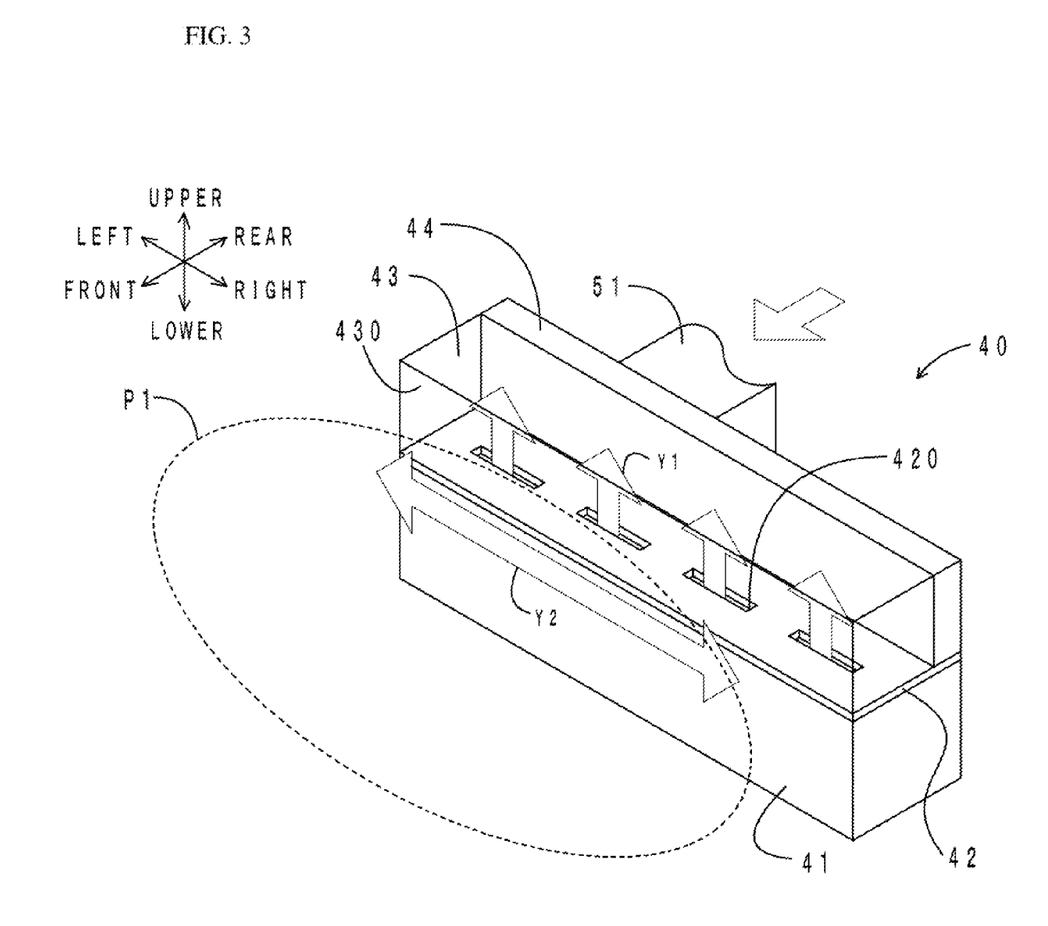
FIG. 3 is a perspective view of a plasma generating unit in a microwave plasma generation apparatus that is a component of the magnetron sputtering deposition system.

FIG. 3 shows a perspective view of a plasma generating unit in the microwave plasma generation apparatus according to the present invention. FIG. 3 is a view that shows one embodiment of the plasma generating unit (see a first embodiment described later). FIG. 3 does not specifically limit the microwave plasma generation apparatus according to the present invention.

As shown in FIG. 3, the plasma generating unit 40 includes a waveguide 41, a slot antenna 42, a dielectric portion 43 and a dielectric portion fixing plate 44. A tubular portion 51 that transmits a microwave is connected to the rear side of the left end of the waveguide 41. The slot antenna 42 is arranged so as to close the upper opening of the waveguide 41. That is, the slot antenna 42 forms the upper wall of the waveguide 41. A plurality of oblong hole-shaped slots 420 are formed in the slot antenna 42. The dielectric portion 43 is arranged on the upper face of the slot antenna 42 so as to cover the slots 420. A microwave transmitted from the tubular portion 51 passes through the slots 420 and enters the dielectric portion 43 as indicated by the outlined arrows Y1 in the up-and-down direction in the drawing. The microwave that has entered the dielectric portion 43 mainly propagates along a front face 430 of the dielectric portion 43 as indicated by the outlined arrow Y2 in the lateral direction in the drawing. Thus, microwave plasma P1 is generated. Here, the incident direction in which the microwave enters from the slots 420 to the dielectric portion 43 is parallel to the front face 430 (plasma generating region-side front face) of the dielectric portion 43. The microwave is caused to enter along the generated microwave plasma P1, so the microwave that is a plasma source tends to propagate over the microwave plasma P1. Therefore, it is presumably possible to generate plasma even under a low pressure of lower than or equal to 1 Pa. Thus, with the microwave plasma generation apparatus according to the present invention, it is possible to generate microwave plasma even under low pressure. Thus when the microwave plasma generation apparatus according to the present invention is used, it is possible to carry out film deposition using magnetron plasma while radiating microwave plasma. Film deposition using magnetron plasma will be described in detail later in (6).

(2) In the configuration of the above (1), the microwave plasma generation apparatus according to the present invention desirably generates the microwave plasma under a pressure of higher than or equal to 0.5 Pa and lower than or equal to 100 Pa. With this configuration, it is possible to generate microwave plasma under a low pressure of about 0.5 to 1.0 Pa suitable for magnetron sputtering.

(3) Preferably, in the configuration of the above (1) or (2), the microwave plasma generation apparatus according to the present invention may further include a support plate that is arranged on a back face of the dielectric portion and that supports the dielectric portion and a permanent magnet that is arranged on a back face of the support plate and that forms a magnetic field in the plasma generating region, and may generate ECR plasma while causing electron cyclotron resonance (ECR) through the microwave that propagates from the dielectric portion into the magnetic field.

In the microwave plasma generation apparatus of the above configuration, a plasma generating region-side face is referred to as "front face", and a face on the opposite side from the front face is referred to as "back face". In the above configuration, the microwave is caused to enter along microwave plasma generated (configuration of the above (1)), and ECR plasma is generated while electron cyclotron resonance (ECR) is caused. Hereinafter, an example of the plasma generating unit in the microwave plasma generation apparatus of the above configuration will be described.

Figure 5:
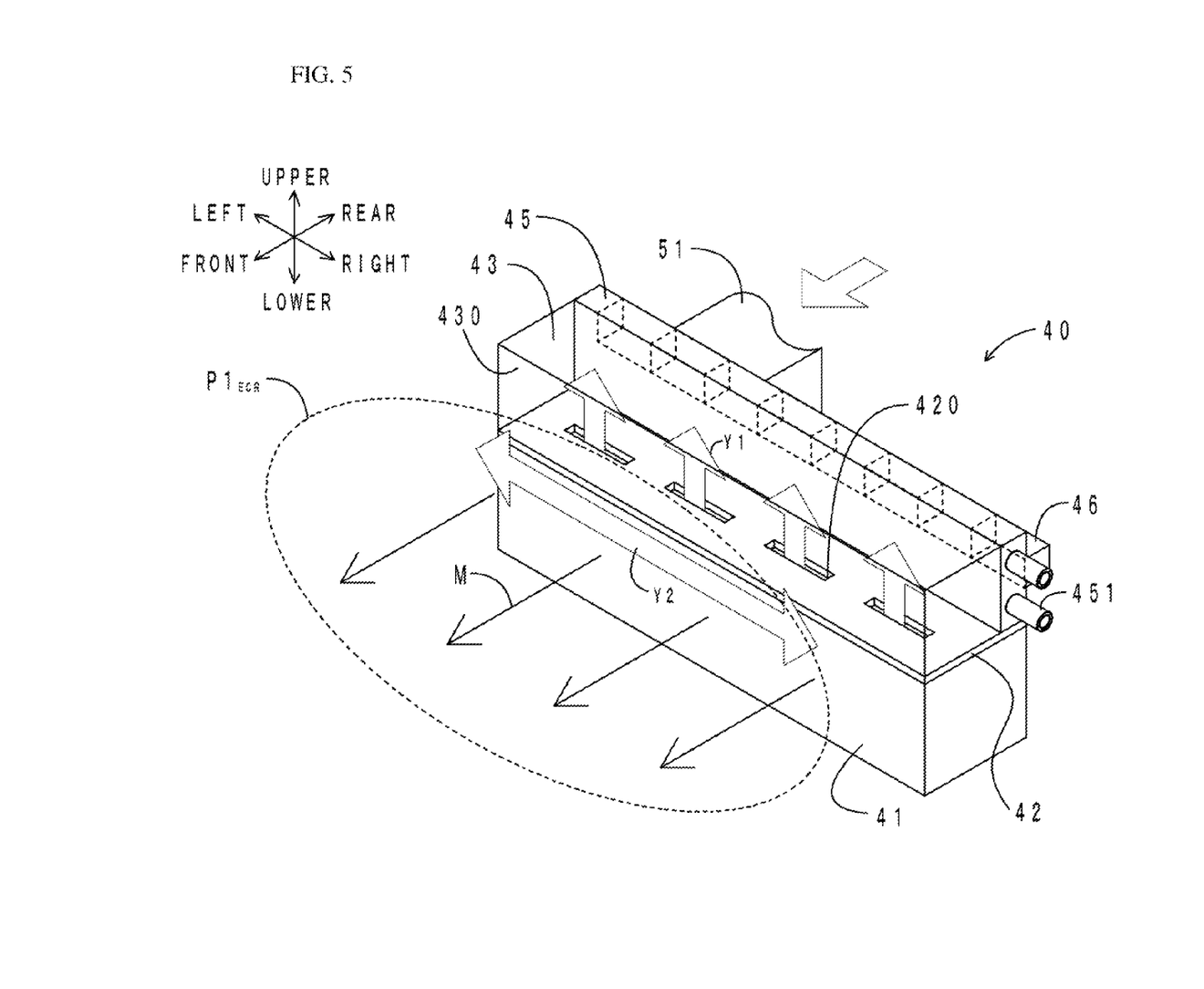
FIG. 5 is a perspective view of a plasma generating unit in a microwave plasma generation apparatus that is a component of the magnetron sputtering deposition system.

FIG. 5 shows a perspective view of the plasma generating unit in the microwave plasma generation apparatus of the above configuration. In FIG. 5, like reference numerals denote members corresponding to those in FIG. 3. FIG. 5 is a view that shows an embodiment of the plasma generating unit (see a second embodiment described later). FIG. 5 does not specifically limit the microwave plasma generation apparatus according to the present invention.

As shown in FIG. 5, the plasma generating unit 40 includes the waveguide 41, the slot antenna 42, the dielectric portion 43, a support plate 45 and permanent magnets 46. The tubular portion 51 that transmits a microwave is connected to the rear side of the left end of the waveguide 41. The slot antenna 42 is arranged so as to close the upper opening of the waveguide 41. That is the slot antenna 42 forms the upper wall of the waveguide 41. The plurality of oblong hole-shaped slots 420 are formed in the slot antenna 42. The dielectric portion 43 is arranged on the upper face of the slot antenna 42 so as to cover the slots 420.

The microwave transmitted from the tubular portion 51 passes through the slots 420 and enters the dielectric portion 43 as indicated by the outlined arrows Y1 in the up-and-down direction in the drawing. The microwave that has entered the dielectric portion 43 mainly propagates along the front face 430 of the dielectric portion 43 as indicated by the outlined arrow Y2 in the lateral direction in the drawing. Thus, microwave plasma is generated. Here, the incident direction in which the microwave enters from the slots 420 to the dielectric portion 43 is parallel to the front face 430 (Plasma generating region-side front face) of the dielectric portion 43. The microwave is caused to enter along the generated microwave plasma, so the microwave that is a plasma source tends to propagate over the microwave plasma.

In addition, the eight permanent magnets 46 are arranged on the rear side of the dielectric, portion 43 via the support plate 45. Each of the eight permanent magnets 46 has an N-pole at its front side and an S-pole at its rear side. Magnetic lines of force M are generated forward from the respective permanent magnets 46. Thus, a magnetic field is formed on the front side (in the plasma generating region) of the dielectric portion 43.

Electrons in the generated microwave plasma perform clockwise orbital motion with respect to the magnetic lines of force M in accordance with a cyclotron angular frequency $\omega_{ce}$. On the other hand, the microwave that propagates through microwave plasma excites a clockwise circularly polarized wave called electron cyclotron wave. When the electron cyclotron wave propagates forward and the angular frequency $\omega$ of the electron cyclotron wave coincides with the cyclotron angular frequency $\omega_{ce}$, the electron cyclotron wave attenuates, and the wave energy is absorbed by electrons. That is, ECR occurs. For example, when the frequency of the microwave is 2.45 GHz, ECR occurs at a magnetic flax density of 0.0875 T. Electrons of which energy has increased due to ECR collide with peripheral neutral particles while being restrained to the magnetic lines of force M. Thus, neutral particles ionize one after another. Electrons generated through ionization are also accelerated through ECR, and further ionize neutral particles. In this way, high-density ECR plasma $P1_{ECR}$ is generated on the front side of the dielectric portion 43.

In this way, with the microwave plasma generation apparatus of the above configuration, by causing the microwave to enter along microwave plasma generated and increasing a plasma density utilizing ECR, it is possible to generate plasma under a low pressure of lower than or equal to 1 Pa and, further, under an extremely low pressure of lower than or equal to 0.1 Pa. Thus, when the microwave plasma generation apparatus of the above configuration is used, it is possible to carry out film deposition using magnetron plasma while radiating ECR plasma under low pressure or under extremely low pressure.

An ECR plasma generation apparatus that uses a microwave is described in the above Patent Document 4. In the ECR plasma generation apparatus of Patent Document 4, a magnetic field is formed by an air-core coil. However, if the air-core coil is used, it is not possible to generate plasma over a wide area having a long length, due to restriction by a coil diameter or the like. In this respect, with the microwave plasma generation apparatus of the above configuration, it is possible to generate long ECR plasma by arranging slots in the longitudinal direction using a long rectangular waveguide. Thus, when assembled to a magnetron sputtering deposition system, it is possible to form a large-area thin film. The magnetron sputtering deposition system will be described in detail later in (8).

(4) Preferably, in the configuration of the above (3), the support plate may have cooling means for suppressing an increase in temperature of the permanent magnet.

The permanent magnet is arranged on the rear face side of the dielectric portion via the support plate. Therefore, at the time of generating plasma, the temperature of the permanent magnet tends to increase. When the temperature of the permanent magnet becomes higher than or equal to Curie temperature, magnetism is lost. With the above configuration, an increase in the temperature of the permanent magnet is suppressed by the cooling means of the support plate. Therefore, it is less likely that the magnetism of the permanent magnet is lost. Thus, with the above configuration, it possible to form a stable magnetic field.

(5) The microwave plasma generation apparatus of the configuration in the above (3) or (4) is able to generate the plasma under a pressure of higher than or equal to 0.05 Pa and lower than or equal to 100 Pa. In order to expand the generated plasma, it is desirable to generate the plasma under a pressure of higher than or equal to 0.05 Pa and lower than or equal to 10 Pa.

(6) A first magnetron sputtering, deposition system according to the present invention is a magnetron sputtering deposition system that includes: a base material; a target; and magnetic field forming means for forming a magnetic field on a surface of the target, and that sputters the target using plasma generated through magnetron discharge and forms a thin film by causing ejected sputtered particles to adhere to a surface of the base material. The first magnetron sputtering deposition system is characterized by further including the microwave plasma generation apparatus of the configuration in the above (1) or (2), wherein the microwave plasma generation apparatus radiates microwave plasma between the base material and the target.

In the first magnetron sputtering deposition system according to the present invention, film deposition using magnetron plasma is carried out while radiating microwave plasma. When microwave plasma is radiated between the base material and the target, it is possible to stably keep magnetron plasma even when the applied voltage is decreased. Thus, it is possible to suppress ejection of particles having a large particle diameter, such as cluster particles, from the target. As a result, variations in particle diameter among sputtered particles are suppressed, so it is possible to reduce asperities of the surface of the thin film formed.

In addition, with the microwave plasma generation apparatus of the configuration in the above (1) or (2), it is possible to generate and radiate microwave plasma even under a low pressure of lower than or equal to 1 Pa. Thus, with the first magnetron sputtering deposition system according to the present invention, it is possible to form a thin film having small asperities on its surface while keeping film quality.

(7) Preferably in the configuration of the above (6), formation of the thin film may be performed under a pressure of higher than or equal to 0.5 Pa and lower than or equal to 3 Pa.

By setting the inside of a vacuum casing in a high vacuum state of lower than or equal to 3 Pa, magnetron plasma becomes stable, and it is possible to suppress entry of impurities and elongate a mean free process. Thus, the film quality of the thin film formed improves.

(8) A second magnetron sputtering deposition system according to the present invention is a magnetron sputtering deposition system that includes: a base material; a target; and magnetic field forming means for forming a magnetic field on a surface of the target, and that sputters the target using plasma generated through magnetron discharge and forms a thin film by causing ejected sputtered particles to adhere to a surface of the base material. The second magnetron sputtering deposition system is characterized by further including the microwave plasma generation apparatus of the configuration in any one of the above (3) to (5), wherein the microwave plasma generation apparatus radiates ECR plasma between the base material and the target.

In the second magnetron sputtering deposition system according to the present invention, film deposition using magnetron plasma is carried out while radiating ECR plasma. When ECR plasma is radiated between the base material and the target, it is possible to stably keep magnetron plasma even when the applied voltage is decreased. Thus, it is possible to suppress ejection of particles having a large particle diameter, such as cluster particles, from the target. As a result, variations in particle diameter among sputtered particles are suppressed, so it is possible to reduce asperities of the surface of the thin film formed. In addition, when ECR plasma is radiated, sputtered particles become fine. Therefore, it is possible to form a farther fine-textured thin film.

In addition, with the microwave plasma generation apparatus of the configuration in any one of the above (3) to (5), it is possible to generate plasma even under a low pressure of lower than or equal to 1 Pa, and further under an extremely low pressure of lower than or equal to 0.1 Pa. Thus, by carrying out magnetron sputtering under lower pressure, it is possible to suppress entry of impurities and to elongate the mean free path of target particles. Thus, the film quality of the thin film formed improves.

A magnetron sputtering deposition system that utilizes ECR is described in the above Patent Document 5. In the magnetron sputtering deposition system of Patent Document 5, magnets are arranged on the back side of a base material on which a film is formed, and ECR plasma is generated near the surface of the base material. However, if the magnets are arranged on the back side of the base material, variations in the thickness of a thin film formed tend to occur. In addition, there is also a problem that the thin film tends to be colored. In addition, in the magnetron sputtering deposition system of Patent Document 5, microwaves are radiated from helical antennas. Therefore, microwaves do not easily propagate in a uniform manner over the entire plasma generating region. In addition, there is no directivity based on a magnetic field from the antennas to the plasma generating region.

In this regard, in the microwave plasma generation apparatus of the configuration in any one of the above (3) to (5), the permanent magnet is arranged on the back face side of the dielectric, portion, and the microwave is caused to propagate along the surface of the dielectric portion. That is, no permanent magnet is arranged near the base material. Thus, with the second magnetron sputtering deposition system according to the present invention, the above problem in the magnetron sputtering deposition system of Patent Document 5 does not arise.

(9) Preferably, in the configuration of the above (8), formation of the thin film may be performed under a pressure of higher than or equal to 0.05 Pa and lower than or equal to 3 Pa.

By setting the inside of a vacuum casing in a high vacuum state of higher than or equal to 0.05 Pa and lower than or equal to 3 Pa, magnetron plasma becomes stable, and it is possible to suppress entry of impurities and elongate a mean free path of target particles. Thus, the film quality of the thin film formed improves.

DESCRIPTION OF THE REFERENCE NUMERALS

1/ MAGNETRON SPUTTERING DEPOSITION SYSTEM
20/ BASE MATERIAL
21/ BASE MATERIAL SUPPORT MEMBER
210/ TABLE PORTION
211/ LEG PORTION
30/ TARGET
31/ BACKING PLATE
32a TO 32c/ PERMANENT MAGNET (MAGNETIC FIELD FORMING MEANS)
33/ CATHODE
34/ EARTH SHIELD
35/ DIRECT-CURRENT PULSED POWER SOURCE
4/ MICROWAVE PLASMA GENERATION APPARATUS
40/ PLASMA GENERATING UNIT
41/ WAVEGUIDE (RECTANGULAR WAVEGUIDE)
42/ SLOT ANTENNA
43/ DIELECTRIC PORTION
44/ DIELECTRIC PORTION FIXING PLATE
45/ SUPPORT PLATE
46/ PERMANENT MAGNET
420/ SLOT
430/ FRONT FACE
450/ REFRIGERANT PASSAGE (COOLING MEANS)
451/ COOLING TUBE
50/ MICROWAVE TRANSMISSION UNIT
51/ TUBULAR PORTION
52/ MICROWAVE POWER SUPPLY
53/ MICROWAVE OSCILLATOR
54/ ISOLATOR
55/ POWER MONITOR
56/ EH MATCHING DEVICE
8/ VACUUM CASING
80/ GAS SUPPLY HOT
82/ EXHAUST HOLE
M/ MAGNETIC LINES OF FORCE
P1/ MICROWAVE PLASMA
$P1_{ECR}$/ PLASMA
P2/ MAGNETRON PLASMA

MODES FOR CARRYING OUT THE INVENTION

Hereinafter, embodiments of a microwave plasma generation apparatus and a magnetron sputtering deposition system including the microwave plasma generation apparatus according to the present invention will be described.

First Embodiment

Magnetron Sputtering Deposition System

Figure 1:
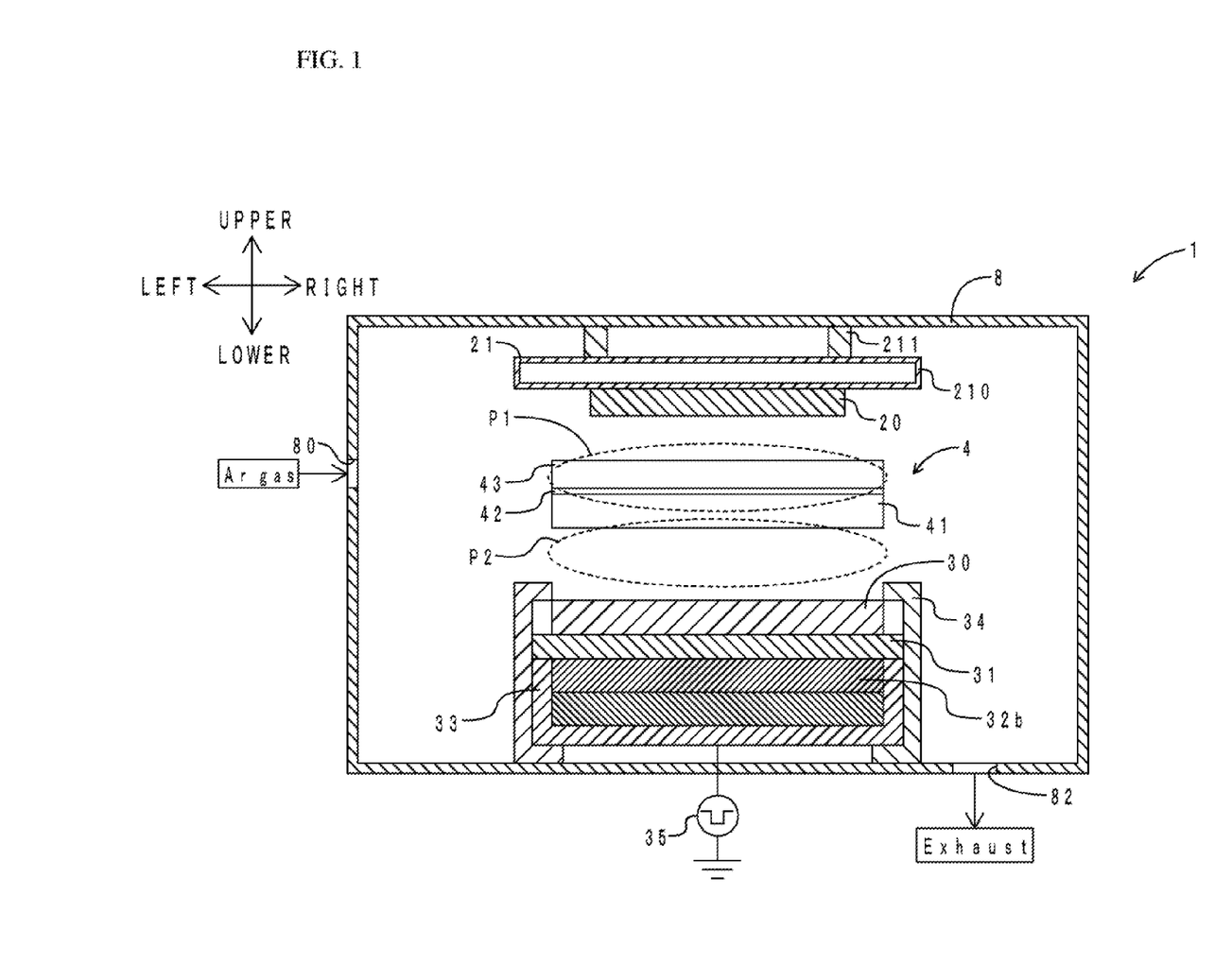
FIG. 1 is a lateral sectional view of a magnetron sputtering deposition system according to a first embodiment.
Figure 2:
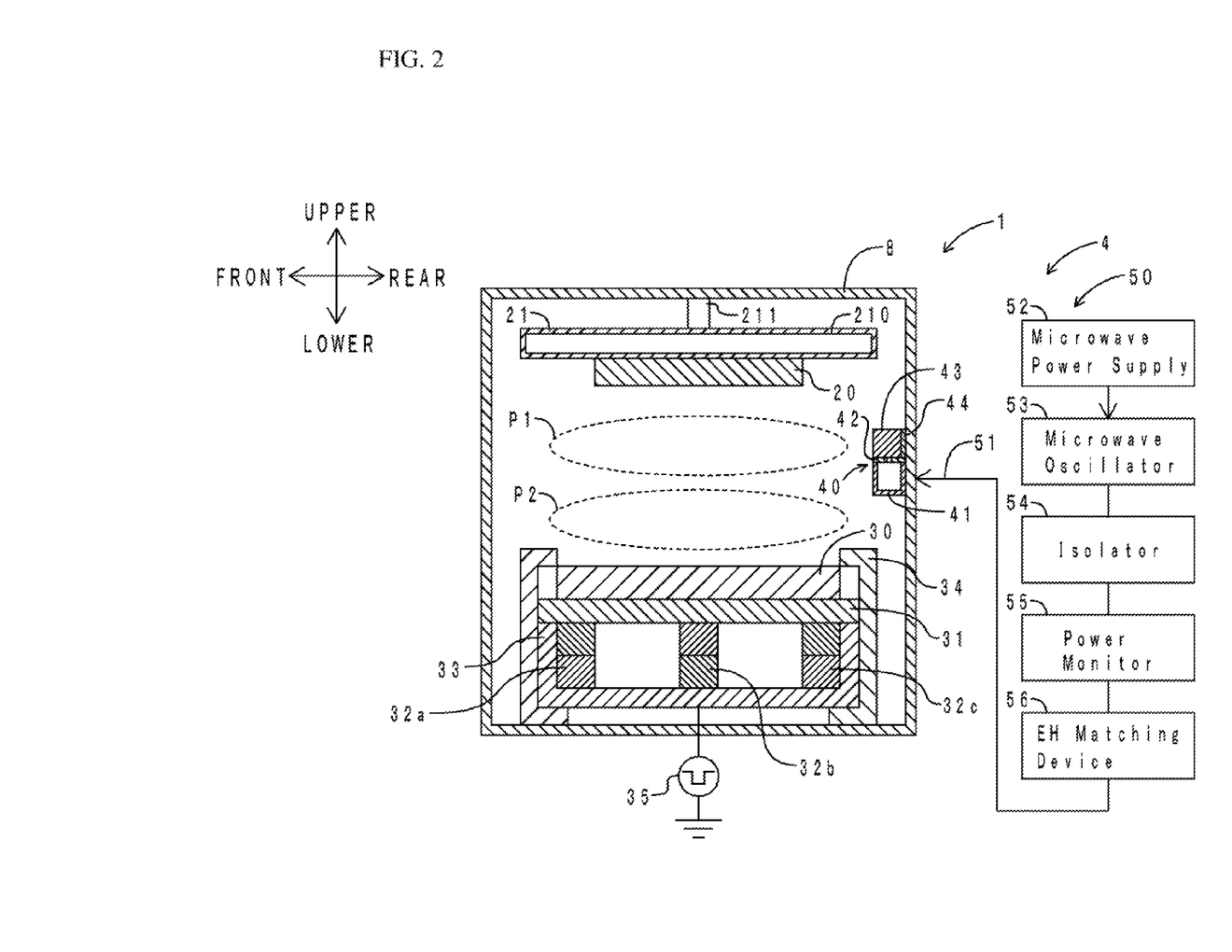
FIG. 2 is a front-to-rear sectional view of the magnetron sputtering deposition system.

First, the configuration of the magnetron sputtering deposition system according to the present embodiment will be described. FIG. 1 shows a lateral sectional view of the magnetron sputtering deposition system according to the present embodiment. FIG. 2 shows a front-to-rear sectional view of the magnetron sputtering deposition system. FIG. 3 shows a perspective view of a plasma generating unit in the microwave plasma generation apparatus that is a component of the magnetron sputtering deposition system.

As shown in FIG. 1 to FIG. 3, the magnetron sputtering deposition system 1 includes a vacuum casing 8, a base material 20, a base material support member 21, a target 30, a backing plate 31, permanent magnets 32a to 32c, a cathode 33 and a microwave plasma generation apparatus 4. The magnetron sputtering deposition system 1 is included in the first magnetron sputtering deposition system according to the present invention.

The vacuum casing 8 is made of aluminum steel, and has a rectangular parallelepiped box shape. A gas supply hole 80 is formed through the left wall of the vacuum casing 8. The downstream end of a gas supply tube (not shown) for supplying argon (Ar) gas into the vacuum casing 8 is connected to the gas supply hole 80. An exhaust hole 82 is formed through the lower wall of the vacuum casing 8. A vacuum exhaust device (not shown) for exhausting gas inside the vacuum casing 8 is connected to the exhaust hole 82.

The base material support member 21 has a table portion 210 and a pair of leg portions 211. The table portion 210 is made of stainless steel, and has a hollow rectangular plate shape. The inside of the table portion 210 is filled with coolant. The table portion 210 is cooled through circulation of coolant. The pair of leg portions 211 are arranged on the upper face of the table portion 210 so as to be laterally spaced apart from each other. The pair of leg portions 211 each are made of stainless steel and each have a circular columnar shape. The outer periphery of each of the pair of leg portions 211 is covered with an insulating layer. The table portion 210 is connected to the upper wall of the vacuum casing 8 via the pair of leg portions 211.

The base material 20 is a polyethylene terephthalate (PET), and has a rectangular shape. The base material 20 is stuck to the lower face of the table portion 210.

The cathode 33 is made of stainless steel, and has a rectangular parallelepiped box shape that is open upward. An earth shield 34 is arranged around the cathode 33, the target 30 and the backing plate 31. The cathode 33 is arranged on the lower face of the vacuum casing 8 via the earth shield 34. The cathode 33 is connected to a direct-current pulsed power supply 35.

The permanent magnets 32a to 32c are arranged inside the cathode 33. The permanent magnets 32a to 32c each have a long rectangular parallelepiped shape. The permanent magnets 32a to 32c are arranged parallel to one another so as to be spaced apart from each other in the front-to-rear direction. Each of the permanent magnet 32a and the permanent magnet 32c has an S-pole at its upper side and an N-pole at its lower side. The permanent magnet 32b has an N-pole at its upper side and an S-pole at its lower side. A magnetic field is formed on the surface of the target 30 by the permanent magnets 32a to 32c. The permanent magnets 32a to 32c are included in magnetic field forming means in the present invention.

The backing plate 31 is made of copper, and has a rectangular plate shape. The backing plate 31 is arranged so as to cover the upper opening of the cathode 33.

The target 30 is a complex oxide (ITO) of indium oxide and tin oxide, and has a rectangular thin plate shape. The target 30 is arranged on the upper face of the backing plate 31. The target 30 is arranged so as to face the base material 20.

The microwave plasma generation apparatus 4 includes the plasma generating unit 40 and a microwave transmission unit 50. The microwave transmission unit 50 includes a tubular portion 51, a microwave power supply 52, a microwave oscillator 53, an isolator 54, a power monitor 55 and an EH matching device 56. The microwave oscillator 53, the isolator 54, the power monitor 55 and the EH matching device 56 are coupled by the tubular portion 51. The tubular portion 51 is connected to the rear side of a waveguide 41 of the plasma generating unit 40 via, a waveguide hole formed through the rear wall of the vacuum casing 8.

The plasma generating unit 40 includes the waveguide 41, a slot antenna 42, a dielectric portion 43 and a dielectric portion fixing plate 44. As shown in FIG. 3, the waveguide 41 is made of aluminum, and has a rectangular parallelepiped box shape that is open upward. The waveguide 41 extends in the lateral direction. The waveguide 41 is included in the rectangular waveguide in the present invention. The slot antenna 42 is made of aluminum, and has a rector plate shape. The slot antenna 42 closes the opening of the waveguide 41 from above. That is, the slot antenna 42 forms the upper wall of the waveguide 41. Four slots 420 are formed in the slot antenna 42. Each of the slots 420 has an oblong hole shape that extends in the lateral direction. The slots 420 are arranged at positions at which an electric, field is intense.

The dielectric portion 43 is made of quartz, and has a rectangular parallelepiped shape. The dielectric portion 43 is arranged at the front side on the upper face of the slot antenna 42. The dielectric portion 43 covers the slots 420 from above. As described above, a front face 430 of the dielectric portion 43 is arranged parallel to an incident direction Y1 in which a microwave enters from the slots 420. The front face 430 is included in the plasma generating region-side front face of the dielectric portion.

The dielectric portion fixing plate 44 is made of stainless steel, and has a planar plate shape. The dielectric portion fixing plate 44 is arranged on the upper face of the slot antenna 42 so as to be in contact with the rear face (back face) of the dielectric portion 43. The dielectric portion fixing plate 44 supports the dielectric portion 43 from the rear side.

[Magnetron Sputtering Deposition Method]

Next, a deposition method using the magnetron sputtering deposition system 1 will be described. In the deposition method according to the present embodiment, first, the vacuum exhaust device (not shown) is operated to exhaust gas inside the vacuum casing 8 through the exhaust hole 82, thereby placing the inside of the vacuum casing 8 in a decompressed state. Subsequently argon gas is supplied from the gas supply tube into the vacuum casing 8. At this time, the flow rate of argon gas is adjusted such that the pressure in the vacuum casing 8 becomes about 10 to 100 Pa. Subsequently the microwave power supply 52 is turned on. When the microwave power supply 52 is turned on, the microwave oscillator 53 generates a microwave having a frequency of 2.45 GHz. The generated microwave propagates inside the tubular portion 51. Here, the isolator 54 inhibits the microwave reflected from the plasma generating unit 40 from returning to the microwave oscillator 53. The power monitor 55 monitors the output power of generated microwave and the output power of reflected microwave. The EH matching device 56 adjusts the amount of reflected microwave. The microwave that has passed through the inside of the tubular portion 51 propagates inside the waveguide 41. The microwave that propagates inside the waveguide 41 enters the slots 420 of the slot antenna 42. Then, as indicated by the outlined arrows Y1 in FIG. 3, the microwave passes through the slots 420 and enters the dielectric portion 43. The microwave that has entered the dielectric portion 43 mainly propagates along the front face 430 of the dielectric portion 43 as indicated by the outlined arrow Y2 in the drawing. Due to the intense electric field of the microwave, argon gas in the vacuum casing 8 ionizes, and microwave plasma P1 is generated on the front side of the dielectric portion 43. After that, while generation of the microwave plasma P1 is maintained, the flow rate of argon gas is adjusted such that the pressure in the vacuum casing 8 becomes about 0.7 Pa.

Next, voltage is applied to the cathode 33 by turning on the direct-current pulsed power supply 35. Due to magnetron discharge generated through the applied voltage, argon gas ionizes, and magnetron plasma P2 is generated above the target 30. Then, the target 30 is sputtered by the magnetron plasma P2 (argon ions), and sputtered particles are driven out from the target 30. The sputtered particles ejected from the target 30 fly toward the base material 20, and adhere to the lower face of the base material 20, thus forming a thin film. At this time, the microwave plasma. P1 is radiated between the base material 20 and the target 30 (including a region in which the magnetron plasma P2 is generated).

Operation and Advantageous Effects

Next, the operation and advantageous effects of the microwave plasma generation apparatus and the magnetron sputtering deposition system according to the present embodiment will be described. According to the present embodiment, in the microwave plasma generation apparatus 4, the front face 430 of the dielectric portion 43 is arranged perpendicularly to the slot antenna 42. Thus, the incident direction Y1 in which the microwave enters from the slots 420 to the dielectric portion 43 is parallel to the front face 430 of the dielectric portion 43. In this way, the microwave is caused to enter along the generated microwave plasma P1, so the microwave that is a plasma source tends to propagate over the microwave plasma P1. Thus, with the microwave plasma generation apparatus 4, it is possible to generate the microwave plasma P1 under a low pressure of about 0.7 Pa.

The waveguide 41 has a long box shape that extends in the lateral direction. The slots 420 are arranged in series in the lateral direction. Thus, with the microwave plasma generation apparatus 4, it is possible to generate the long microwave plasma P1.

With the magnetron sputtering deposition system 1, it is possible to carry out sputtering deposition using the magnetron plasma P2 while radiating the microwave plasma P1. By radiating the microwave plasma P1, it is possible to stably keep the magnetron plasma P2 even when the applied voltage is decreased. Thus, it is possible to suppress ejection of particles having a large particle diameter, such as cluster particles, from the target 30. As a result, variations in particle diameter among sputtered particles are suppressed, so it is possible to reduce asperities of the surface of a thin film formed. In addition, by setting the inside of the vacuum casing 8 to a high vacuum state of lower than or equal to 1 Pa, the magnetron plasma becomes stable, and it is possible to suppress entry of impurities and elongate a mean free process. Thus, the film quality of a thin film formed improves.

In addition, the microwave plasma generation apparatus 4 is able to generate the long microwave plasma P1. Therefore, with the magnetron sputtering deposition system 1, it is possible to form a long large-area thin film.

Second Embodiment

Magnetron Sputtering Deposition System

A magnetron sputtering deposition system according to the present embodiment differs from the magnetron sputtering deposition system according to the first embodiment in that the configuration of a plasma generating unit of a microwave plasma generation apparatus is changed and microwave plasma utilizing ECR is generated. Thus, here, the difference will be mainly described.

Figure 4:
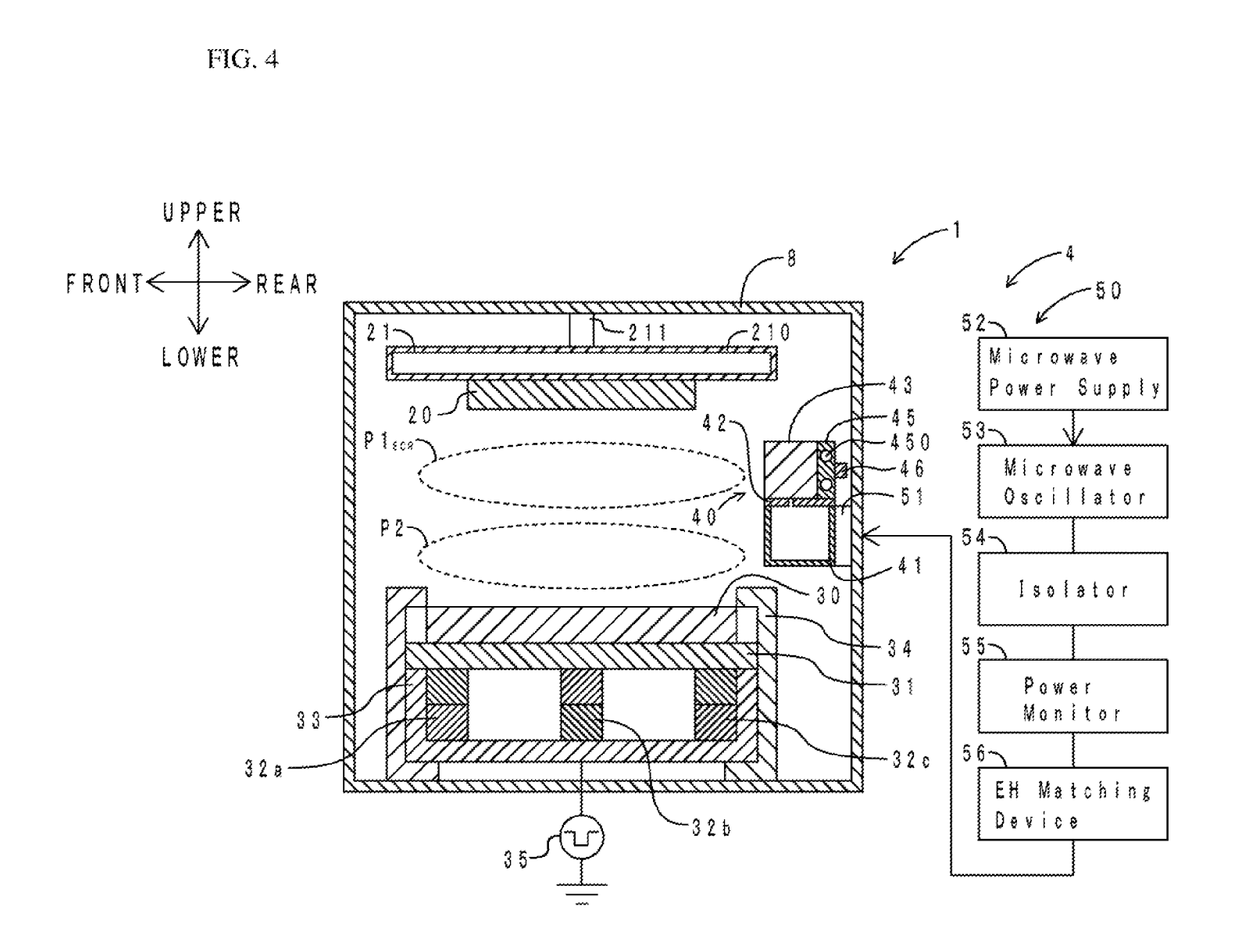
FIG. 4 is a front-to-rear sectional view of a magnetron sputtering deposition system according to a second embodiment.

First, the configuration of the microwave plasma generation apparatus used in the present embodiment will be described. FIG. 4 shows a front-to-rear sectional view of the magnetron sputtering deposition system according to the present embodiment. In addition, FIG. 5 shows a perspective view of the plasma generating unit in the microwave plasma generation apparatus that is a component of the magnetron sputtering deposition system. In FIG. 4, like reference numerals denote members corresponding to those in FIG. 2. In FIG. 5, like reference numerals denote members corresponding to those in FIG. 3.

As shown in FIG. 4 and FIG. 5, the magnetron sputtering deposition system 1 includes the vacuum casing 8, the base material 20, the base material support member 21, the target 30, the backing plate 31, the permanent magnets 32a to 32c, the cathode 33 and the microwave plasma generation apparatus 4. The magnetron sputtering deposition system 1 is included in the second magnetron sputtering deposition system according to the present invention. The configuration other than the plasma generating unit 40 of the microwave plasma generation apparatus 4 is the same as that of the first embodiment. Thus, here, the description is omitted.

The plasma generating unit 40 includes the waveguide 41, the slot antenna 42, the dielectric portion 43, a support plate 45 and permanent magnets 46. The configurations of the waveguide 41, the slot antenna 42 and the dielectric portion 43 are the same as those of the first embodiment.

The support plate 45 is made of stainless steel, and has a planar plate shape. The support plate 45 is arranged on the upper face of the slot antenna 42 so as to be in contact with the rear face (back face) of the dielectric portion 43. A refrigerant passage 450 is formed inside the support plate 45. The refrigerant passage 450 has a U shape that extends in the lateral direction. The right end of the refrigerant passage 450 is connected to cooling tubes 451. The refrigerant passage 450 is connected to a heat exchanger and a pump (both are not shown) outside of the vacuum casing 8 via the cooling tithes 451. Coolant circulates in a path formed of the refrigerant passage 450, the cooling tube 451, the heat exchanger, the pump, the cooling tube 451 and the refrigerant passage 450 again. Due to circulation of coolant, the support plate 45 is cooled. The refrigerant passage 450 and coolant are included in the cooling means for suppressing an increase in the temperature of the permanent magnets 46.

The permanent magnets 46 are neodymium magnets, and each have a rectangular parallelepiped shape. The eight permanent magnets 46 are arranged on the rear face (back face) of the support plate 45. The eight permanent magnets 46 are arranged in series continuously in the lateral direction. The eight permanent magnets 46 each have an N-pole at its front side and an S-pole at its rear side. The magnetic lines of force M are generated forward from the respective permanent magnets 46. Thus, a magnetic field is formed in the plasma generating region that is on the front side of the dielectric portion 43.

[Magnetron Sputtering Deposition Method]

Next, a deposition method using the magnetron sputtering deposition system 1 will be described. In the deposition method according to the present embodiment, similar to the first embodiment, the vacuum exhaust device (not shown) is operated first to exhaust gas inside the vacuum casing 8 through the exhaust hole 82, thereby placing the inside of the vacuum casing 8 in a decompressed state. Subsequently, argon gas is supplied from the gas supply tube into the vacuum casing 8, and the pressure inside the vacuum casing 8 is set to 0.2 Pa. Subsequently, the microwave power supply 52 is turned on. When the microwave power supply 52 is turned on, the microwave oscillator 53 generates a microwave having a frequency of 2.45 GHz. The generated microwave propagates inside the tubular portion 51. Here, the isolator 54 inhibits the microwave reflected from the plasma generating unit 40 from returning to the microwave oscillator 53. The power monitor 55 monitors the output power of generated microwave and the output power of reflected microwave. The EH matching device 56 adjusts the amount of reflected microwave. The microwave that has passed through the inside of the tubular portion 51 propagates inside the waveguide 41. The microwave that propagates inside the waveguide 41 enters the slots 420 of the slot antenna 42. Then, as indicated by the outlined arrows Y1 in FIG. 5, the microwave passes through the slots 420 and enters the dielectric portion 43. The microwave that has entered the dielectric portion 43 mainly propagates along the front face 430 of the dielectric portion 43 as indicated by the outlined arrow Y2 in the drawing. Due to the intense electric field of the microwave, argon gas in the vacuum casing 8 ionizes, and microwave plasma is generated on the front side of the dielectric portion 43.

Electrons in the generated microwave plasma perform clockwise orbital motion with respect to the magnetic lines of force M in accordance with a cyclotron angular frequency. On the other hand, the microwave that propagates through microwave plasma excites an electron cyclotron wave. The angular frequency of the electron cyclotron wave coincides with the cyclotron angular frequency at a magnetic flux density of 0.0875 T. Thus, ECR is generated. Electrons of which energy has increased due to ECR collide with peripheral neutral particles while being restrained to the magnetic lines of force M. Thus, neutral particles ionize one after another. Electrons generated through ionization are also accelerated through ECR, and further ionize neutral particles. In this way high-density ECR plasma $P1_{ECR}$ is generated on the front side of the dielectric portion 43.

Next, voltage is applied to the cathode 33 by turning on the direct-current pulsed power supply 35. Due to magnetron discharge generated through the applied voltage, argon gas ionizes, and magnetron plasma P2 is generated above the target 30. Then, the target 30 is sputtered by the magnetron plasma P2 (argon ions), and sputtered particles are driven out from the target 30. The sputtered particles ejected from the target 30 fly toward the base material 20, and adhere to the lower face of the base material 20, thus forming a thin film. At this time, the ECR plasma $P1_{ECR}$ is radiated between the base material 20 and the target 30 (including a region in which the magnetron plasma P2 is generated).

Operation and Advantageous Effects

Next, the operation and advantageous effects of the microwave plasma generation apparatus and the magnetron sputtering deposition system according to the present embodiment will be described. The microwave plasma generation apparatus and the magnetron sputtering deposition system according to the present embodiment have similar operation and advantageous effects to those of the microwave plasma generation apparatus and magnetron sputtering deposition system for portions having the same configurations. In addition, in the present embodiment, the incident direction Y1 in which the microwave enters from the slots 420 to the dielectric portion 43 is parallel to the front face 430 of the dielectric portion 43. In this case, the microwave enters along microwave plasma generated. Thus, the microwave that is a plasma source tends to propagate over the microwave plasma. In addition, the magnetic field is formed on the front side of the dielectric portion 43. The magnetic lines of force M extend forward from the dielectric portion 43. ECR is caused through propagation of the microwave from the dielectric portion 43 into the magnetic field. Thus, high-density ECR plasma $P1_{ECR}$ is generated on the front side of the dielectric portion 43. In this way, with the microwave plasma generation apparatus 4, by causing the microwave to enter along microwave plasma generated and increasing a plasma density utilizing ECR, it is possible to generate plasma even under a low pressure of about 0.2 Pa.

In addition, the eight permanent magnets 46 are arranged on the rear face of the support plate 45. The refrigerant passage 450 is formed inside the support plate 45. The support plate 45 is cooled by divination of coolant through the refrigerant passage 450. Therefore, the temperature of the permanent magnet 46 is less prone to increase. Thus, it is less likely that the magnetism of the permanent magnet 46 is lost due to an increase in temperature. Thus, even at the time of generation of plasma, a stable magnetic field is formed.

With the magnetron sputtering deposition system 1 according to the present embodiment, it is possible to carry out sputtering deposition using the magnetron plasma P2 while radiating the ECR plasma $P1_{ECR}$. By radiating the ECR plasma $P1_{ECR}$, it is possible to stably keep the magnetron plasma P2 even when the applied voltage is decreased. Thus, it is possible to suppress ejection of particles having a large particle diameter, such as cluster particles, from the target 30. As a result, variations in particle diameter among sputtered particles are suppressed, so it is possible to reduce asperities of the surface of a thin film formed. In addition, when ECR plasma $P1_{ECR}$ is radiated, sputtered particles become fine. Therefore, it is possible to form a further fine-textured thin film.

In addition, by setting the inside of the vacuum casing 8 to a high vacuum state of about 0.2 Pa, the magnetron plasma P2 becomes stable, and it is possible to suppress entry of impurities and elongate a mean free path of target particles. Thus, the film quality of the thin film formed improves.

In addition, with the microwave plasma generation apparatus 4, it is possible to stably generate the ECR plasma $P1_{ECR}$ even under low pressure. Therefore, it is possible to generate the ECR plasma $P1_{ECR}$ and carry out magnetron sputtering with the pressure inside the vacuum casing 8 being set to 0.2 Pa. That is, it is not necessary to carry out magnetron sputtering by generating microwave plasma under a pressure of about 10 to 100 Pa first, stabilizing the microwave plasma, and then decreasing the pressure to a predetermined value. Thus, it is possible to simplify control of the pressure in the vacuum casing 8.

In addition, in the microwave plasma generation apparatus 4, the eight permanent magnets 46 are arranged on the rear side of the dielectric portion 43. The microwave is caused to propagate into the magnetic field formed on the front side of the dielectric portion 43. Therefore, the microwave tends to uniformly propagate over all the plasma generating region. In addition, in comparison with the case where the permanent magnets 46 are arranged on the back side of the base material 20 (the upper face of the table portion 210), variations in the thickness of a thin film formed are small. In addition, coloring of a thin film is also suppressed.

<Others>

The embodiments of the microwave plasma generation apparatus and magnetron sputtering deposition system according to the present invention are described above. However, embodiments of the microwave plasma generation apparatus and magnetron sputtering deposition system according to the present invention are not limited to the above-described embodiments. The present invention may be implemented in various modifications and improvements that can be made by persons skilled in the art.

For example, in the above-described embodiments, 110 is used as the target. However, the material of the target is not specifically limited, and may be determined as needed depending on the type of thin film formed. Similarly, the base material on which a thin film is formed may be selected as needed depending on the intended use. Other than the PET film according to the above-described embodiments, for example, a polyethylene naphthalate (PEN) film, a polyphenylene sulfide (PPS) film, a polyamide (PA) 6 film, a PA11 film, a PA12 film, a PA46 film, a polyamide MXD6 film, a PA9T film, a polyimide (PI) film, a polycarbonate (PC) film, a fluororesin film, an ethylene-vinyl alcohol copolymer (EVOH) film, a polyvinyl alcohol (PVA) film or a polyolefin film of polyethylene (PE), polypropylene (PP), cycloolefin polymer, or the like, may be used.

The material of the slot antenna and the number, shape, arrangement, and the like, of the slots are not specifically limited. For example, the material of the slot antenna just needs to be a non-magnetic metal, and, other than aluminum, may be a stainless steel, a brass, or the like. In addition, the slots may be arranged in two or more rows, rather than in a row. The number of the slots may be odd numbers or may be even numbers. In addition, the slots may be arranged in a zigzag pattern by changing the angle of arrangement of each slot. The material and shape of the dielectric portion are also not specifically limited. The material of the dielectric portion is desirably a material that has a low dielectric constant and does not easily absorb a microwave. For example, other than quartz, aluminum oxide (alumina), or the like, is suitable.

In the above-described second embodiment, the material and shape of the support plate are not specifically limited. In the above-described second embodiment, the refrigerant passage and coolant are arranged as the cooling means of the support plate. However, the configuration of the cooling means of the support plate is not specifically limited. In addition, the support plate may not have the cooling means.

As long as the permanent magnet that forms a magnetic field on the front side of the dielectric (in the plasma generating region) is able to generate ECR, the shape, type, number, arrangement mode, and the like, thereof are not specifically limited. For example, only one permanent magnet may be arranged or a plurality of the permanent magnets may be arranged in two or more rows.

In addition, another permanent magnet may be arranged so as to face the plasma generating unit via the plasma generating region. Specifically, the permanent magnet may be arranged on the front wall of the vacuum casing 8 shown in FIG. 4 so as to face the eight permanent magnets 46. At this time, the additional permanent magnet is arranged such that the front side is an N-pole and the rear side is an S-pole. Thus, the N-poles of the eight permanent magnets 46 face the S-pole of the additional permanent magnet. Therefore, it is possible to generate the ECR plasma $P1_{ECR}$ having further directivity. In addition, the additional permanent magnet also desirably includes cooling means for suppressing an increase in temperature. In this case, for example, the support plate according to the second embodiment, having the refrigerant passage and coolant, just needs to be arranged on the rear side (plasma generating region side) of the permanent magnet.

In the above-described embodiments, the microwave having a frequency of 2.45 GHz is used. However, the frequency of the microwave is not limited to a 2.45 GHz band. As long as the frequency band fills within the range of 300 MHz to 100 GHz, any frequency band may be used. The frequency band in this range is, for example, 8.35 GHz 1.98 GHZ, 915 KHz, or the like.

The material and shape of the vacuum casing, base material support member, backing plate and cathode are not specifically limited. For example, the vacuum casing just needs to be made of a metal. Especially, it is desirable to employ a material having a high conductivity. The table portion of the base material support member is not necessary to be cooled. A non-magnetic conductive material just needs to be used for the backing plate. Especially, a metal material, such as copper, having a high conductivity and a high thermal conductivity is desirable. Other than a stainless steel, a metal, such as aluminum, may be used for the cathode. In addition, the configuration of magnetic field forming means for forming a magnetic field on the surface of the target is also not limited to the above-described embodiments. When the permanent magnet is used as the magnetic field forming means, the type and arrangement mode of the permanent magnet just needs to be determined as needed. For example, the N-pole and S-pole of each permanent magnet may be inverted from those in the above-described embodiments.

Film deposition is carried out under a pressure of 0.7 Pa in the above-described first embodiment, and is carried out under a pressure of 0.2 Pa in the above-described second embodiment. However, the pressure of the deposition treatment is not limited to these pressures. The deposition treatment just needs to be carried out under an optimal pressure as needed. For example, in the first embodiment in which microwave plasma is radiated, a pressure higher than or equal to 0.5 Pa and lower than or equal to 3 Pa is suitable. In addition, in the second embodiment in which ECR plasma is radiated, a pressure higher than or equal to 0.05 Pa and lower than or equal to 3 Pa is suitable. In addition, gas to be supplied may be, other than argon, an inert gas, such as helium (He), neon (Ne) krypton (Kr) and xenon (Xe), nitrogen ($N_2$), oxygen (O), hydrogen ($H_2$), or the like. Two or more types of gases may be mixed and used.

EXAMPLES

Next, the present invention will be further specifically described by way of examples.

<Generation of Microwave Plasma Under Low Pressure>

Example 1

Generation of microwave plasma under low pressure with the use of the microwave plasma generation apparatus 4 according to the first embodiment was studied. Reference numerals of members in the following treatment correspond to those in FIG. 1 to FIG. 3.

First, the gas inside the vacuum casing 8 was exhausted through the exhaust hole 82 by operating the vacuum exhaust device (not shown), and the internal pressure of the vacuum casing 8 was set to $8 \times 10^{-3}$ Pa. Then, argon gas was supplied into the vacuum casing 8, and the internal pressure of the vacuum casing 8 was set to 100 Pa. Subsequently, the microwave power supply 52 was turned on, and the microwave plasma P1 was generated using the oscillated microwave having an output power of 1.4 kW. After that, the flow rate of argon gas was reduced so that the internal pressure of the vacuum casing 8 was set to 50 Pa, 25 Pa, 13 Pa, 7 Pa, 4 Pa, 2 Pa, 1 Pa and 0.5 Pa. Under each pressure, the state where the microwave plasma P1 was generated was visually checked. As a result, under any of the pressures, the microwave plasma P1 was stably generated. At that time, reflection of the microwave that returns toward the microwave oscillator 53 was lower than or equal to 0.1 kW in each case.

Example 2

Generation of ECR plasma under low pressure with the use of the microwave plasma generation apparatus 4 according to the second embodiment was studied. Reference numerals of members in the following treatment correspond to those in FIG. 4 and FIG. 5.

First, the gas inside the vacuum casing 8 was exhausted through the exhaust hole 82 by operating the vacuum exhaust device (not shown), and the internal pressure of the vacuum casing 8 was set to $8 \times 10^{-3}$ Pa. Then, argon gas was supplied into the vacuum casing 8, and the internal pressure of the vacuum casing 8 was set to 100 Pa. Subsequently, the microwave power supply 52 was turned on, and the ECR plasma $P1_{ECR}$ was generated using the oscillated microwave having an output power of 1.4 kW. After that, the flow rate of argon gas was throttled, and the internal pressure of the vacuum casing 8 was set to 13 Pa, 5 Pa, 1 Pa, 0.7 Pa, 0.5 Pa, 0.3 Pa and 0.1 Pa. Under each pressure, the state where the ECR plasma $P1_{ECR}$ was generated was visually checked. As a result, under any of the pressures, the ECR plasma $P1_{ECR}$ was stably generated. At that time, reflection of the microwave that returns toward the microwave oscillator 53 was lower than or equal to 0.1 kW in each case.

Comparative Example

The plasma generating unit 40 of the microwave plasma generation apparatus 4 was changed to the existing plasma generating unit 9 (see FIG. 6 above), and, as in the case of the above Example 1, generation of microwave plasma under low pressure was studied. As a result, when the internal pressure of the vacuum casing 8 was 4 Pa, the generated microwave plasma P became unstable, and blinking started. At that time, reflection of the microwave that returns toward the microwave oscillator 53 was higher than or equal to 0.5 kW. In addition, when the internal pressure of the vacuum casing 8 became 2 Pa, plasma generation could not be continued, and the microwave plasma P disappeared. Of course, under a pressure lower than or equal to 1 Pa, the microwave plasma P could not be generated.

<Formation of Thin Film Using Magnetron Sputtering Deposition System>

Example 1

An ITO film was formed on the surface of a PET film with the use of the magnetron sputtering deposition system 1 according to the first embodiment. Reference numerals of members in the following deposition treatment correspond to those in FIG. 1 to FIG. 3. First, the gas inside the vacuum casing 8 was exhausted through the exhaust hole 82 by operating the vacuum exhaust device (not shown), and the internal pressure of the vacuum casing 8 was set to $8 \times 10^{-3}$ Pa. Then, argon gas was supplied into the vacuum casing 8, and the internal pressure of the vacuum casing 8 was set to 25 Pa. Subsequently, the microwave power supply 52 was turned on, and the microwave plasma P1 was generated using the oscillated microwave having an output power of 1.4 kW. Immediately after that, the flow rate of argon gas was reduced, and the internal pressure of the vacuum casing 8 was set to 0.65 Pa. Furthermore, a small amount of oxygen gas was supplied into the vacuum casing, 8, and the internal pressure of the vacuum casing 8 was set to 0.67 Pa. At that time, the microwave plasma P1 was stably generated, and reflection of the microwave was also lower than or equal to 0.1 kW.

In this state, the direct-current pulsed power supply 35 (RPG-100, Pulsed DC Plasma Generator, produced by MKS instruments Japan. Inc.) was turned on under setting conditions of output power of 1500 W, frequency of 100 kHz and pulse width of 3056 ns, voltage was applied to the cathode 33, and the magnetron plasma P2 was generated. Then, the target 30 was sputtered using the magnetron plasma P2, the microwave plasma P1 was radiated, and thus the ITO film was formed on the surface of the base material 20 (PET film). The voltage at the time of film deposition was 260 V (the voltage was automatically controlled by the direct-current pulsed power supply 35, and the same applies to the following), and, in comparison with the following Comparative Example 1, the applied voltage was able to be reduced by about 20%.

Comparative Example 1

In the magnetron sputtering deposition system 1 according to the above-described first embodiment, the plasma generating unit 40 of the microwave plasma generation apparatus 4 was changed to the existing plasma generating unit 9 (see FIG. 6 above), and generation of microwave plasma was attempted under the same conditions as those of the above-described Example 1. However, as in the case of the study of generation of microwave plasma under low pressure, plasma disappeared under a situation that the internal pressure of the vacuum casing 8 was 0.65 Pa.

Then, a small amount of oxygen gas was supplied into the vacuum casing 8, the internal pressure of the vacuum casing 8 was set to 0.67 Pa, the direct-current pulsed power supply 35 (the same as described above) was turned on under the setting conditions of output power of 1500 W, frequency of 100 kHz and pulse width of 3056 ns, and then generation of microwave plasma was attempted; however, plasma was not able to be generated.

Therefore, without operating the microwave plasma generation apparatus 4 (without generating the microwave plasma P1), the magnetron plasma P2 was generated under the same conditions as those in the above-described Example 1. Then, the target 30 was sputtered using the magnetron plasma P2, and the 110 film was formed on the surface of the base material 20 (PET film). The voltage at the time of film deposition was 310 V.

Example 2

An ITO film was formed on the surface of a PET film with the use of the magnetron sputtering deposition system 1 according to the second embodiment. Reference numerals of members in the following deposition treatment correspond to those in FIG. 4 and FIG. 5. First, the gas inside the vacuum casing 8 was exhausted through the exhaust hole 82 by operating the vacuum exhaust device (not shown), and the internal pressure of the vacuum casing 8 was set to $8 \times 10^{-3}$ Pa. Then, argon gas was supplied into the vacuum casing 8, and the internal pressure of the vacuum casing 8 was set to 0.2 Pa. Subsequently, the microwave power supply 52 was turned on, and the ECR plasma. $P1_{ECR}$ was generated using the oscillated microwave having an output power of 1.4 kW. After that, a small amount of oxygen gas was further supplied into the vacuum casing 8, the flow rate of argon gas was adjusted, and the internal pressure of the vacuum casing 8 was set to 0.2 Pa similarly. At that time, the ECR plasma P1$_{ECR}$ was stably generated, and reflection of the microwave was also lower than or equal to 0.1 kW.

In this state, the direct-current pulsed power supply 35 was turned on under setting conditions of output power of 1500 W, frequency of 100 kHz and pulse width of 3056 us, voltage was applied to the cathode 33, and the magnetron plasma P2 was generated. Then, the target 30 was sputtered using the magnetron plasma P2, the ECR plasma P1$_{ECR}$ was radiated, and thus the ITO film was formed on the surface of the base material 20 (PET film). The voltage at the time of film deposition was 270 V, and, in comparison with the following Comparative Example 2, the applied voltage was able to be reduced by about 10%.

Comparative Example 2

In the magnetron sputtering deposition system 1 according to the above-described second embodiment, the plasma generating unit 40 of the microwave plasma generation apparatus 4 was changed to the existing plasma generating unit 9 (see FIG. 6 above), and generation of microwave plasma was attempted under the same conditions as those of the above-described Example 2. However, as in the case of the study of generation of microwave plasma under low pressure, plasma disappeared under a situation that the internal pressure of the vacuum casing 8 was 0.2 Pa.

Therefore, without operating the microwave plasma generation apparatus 4 (without generating the ECR plasma P1$_{ECR}$), the magnetron plasma P2 was generated under the same conditions as those in the above-described Example 2. Then, the target 30 was sputtered using the magnetron plasma P2, and the ITO film was formed on the surface of the base material 20 (PET film). The voltage at the time of film deposition was 300 V.

Example 3

An 110 film was formed on the surface of the PET film as in the case of the above-described Example 2 except that the internal pressure of the vacuum casing 8 at the time of generating the ECR plasma P1$_{ECR}$ was decreased to 0.1 Pa. That is, first, gas inside the vacuum casing 8 was exhausted through the exhaust hole 82, and the internal pressure of the vacuum casing 8 was set to $8 \times 10^{-3}$ Pa. Then, argon gas was supplied into the vacuum casing 8, and the internal pressure of the vacuum casing 8 was set to 0.1 Pa. Subsequently, the microwave power supply 52 was turned on, and the ECR plasma P1$_{ECR}$ was generated using the oscillated microwave having an output power of 1.4 kW. After that, a small amount of oxygen gas was further supplied into the vacuum casing 8, the flow rate of argon gas was adjusted, and the internal pressure of the vacuum casing 8 was set to 0.1 Pa similarly. At that time, the ECR plasma P1$_{ECR}$ was stably generated, and reflection of the microwave was also lower than or equal to 0.1 kW.

In this state, the direct-current pulsed power supply 35 was turned on, voltage was applied to the cathode 33, and the magnetron plasma P2 was generated. Then, the target 30 was sputtered using the magnetron plasma P2, the ECR plasma P1$_{ECR}$ was radiated, and thus the ITO film was formed on the surface of the base material 20 (PET film). The voltage at the time of film deposition as 290 V, and unlike the following Comparative Example 3, the magnetron plasma P2 did not disappear.

Comparative Example 3

In the magnetron sputtering deposition system 1 according to the above-described second embodiment, the plasma generating unit 40 of the microwave plasma generation apparatus 4 was changed to the existing plasma generating unit 9 (see FIG. 6 above), and generation of microwave plasma was attempted under the same conditions as those of the above-described Example 3. However, as in the case of the above-described Comparative Example 2, plasma disappeared under a situation that the internal pressure of the vacuum casing 8 was 0.1 Pa.

Therefore, without operating the microwave plasma generation apparatus 4 (without generating the ECR plasma P1$_{ECR}$), generation of the magnetron plasma P2 was attempted under the same conditions as those of the above-described Example 3. However, magnetron plasma was not able to be generated.

INDUSTRIAL APPLICABILITY

The microwave plasma generation apparatus and the magnetron sputtering deposition system using the microwave plasma generation apparatus according to the present invention are useful in formation of a transparent conductive film, or the like, that is, for example, used in a touch panel, a display light-emitting diode (LED) illumination, a solar battery, electronic paper, or the like.

The invention claimed is:

1. A microwave plasma generation apparatus that ionizes gas supplied into a vacuum casing to generate microwave plasma, comprising:
    a rectangular waveguide that transmits a microwave;
    a slot antenna that forms one face of the rectangular waveguide and that has a plurality of slots through which the microwave passes at the one face of the rectangular waveguide, wherein each of the plurality of slots has an oblong hole shape that extends in a longitudinal direction of the rectangular waveguide; and
    a single dielectric portion that is arranged in direct physical contact with the slot antenna that forms the one face of the rectangular waveguide, so as to cover the plurality of slots of the slot antenna and so that microwaves having passed through the plurality of slots enter the single dielectric portion in an incident direction, the single dielectric portion having a plasma generating region-side front face parallel to the incident direction and perpendicular to the one face of the rectangular waveguide at which the slot antenna is arranged.

2. The microwave plasma generation apparatus according to claim 1, wherein the microwave plasma generation apparatus is able to generate the microwave plasma under a pressure of higher than or equal to 0.5 Pa and lower than or equal to 100 Pa.

3. The microwave plasma generation apparatus according to claim 1, further comprising:
    a support plate that is arranged on a back face of the single dielectric portion and that supports the single dielectric portion; and
    a permanent magnet that is arranged on a back face of the support plate and that forms a magnetic field in the plasma generating region, wherein
    ECR plasma is generated while electron cyclotron resonance (ECR) is generated by the microwave that propagates from the single dielectric portion into the magnetic field.

4. The microwave plasma generation apparatus according to claim 3, wherein the support plate has cooling means for suppressing an increase in temperature of the permanent magnet.

5. The microwave plasma generation apparatus according to claim 3, wherein the microwave plasma generation apparatus is able to generate the ECR plasma under a pressure of higher than or equal to 0.05 Pa and lower than or equal to 100 Pa.

6. The microwave plasma generation apparatus according to claim 4, wherein the microwave plasma generation apparatus is able to generate the ECR plasma under a pressure of higher than or equal to 0.05 Pa and lower than or equal to 100 Pa.

7. A magnetron sputtering deposition system that includes: a base material; a target; and a permanent magnet for forming a magnetic field on a surface of the target, and that sputters the target using plasma generated through magnetron discharge and forms a thin film by causing ejected sputtered particles to adhere to a surface of the base material, the magnetron sputtering deposition system characterized by further comprising:

the microwave plasma generation apparatus according to claim 1, wherein the microwave plasma generation apparatus radiates microwave plasma between the base material and the target.

8. The magnetron sputtering deposition system according to claim 7, wherein formation of the thin film is performed under a pressure of higher than or equal to 0.5 Pa and lower than or equal to 3 Pa.

9. A magnetron sputtering deposition system that includes: a base material; a target; and a permanent magnet for forming a magnetic field on a surface of the target, and that sputters the target using plasma generated through magnetron discharge and forms a thin film by causing ejected sputtered particles to adhere to a surface of the base material, the magnetron sputtering deposition system further comprising:

the microwave plasma generation apparatus according to claim 3, wherein the microwave plasma generation apparatus radiates ECR plasma between the base material and the target.

10. A magnetron sputtering deposition system that includes: a base material; a target; and a permanent magnet for forming a magnetic field on a surface of the target, and that sputters the target using plasma generated through magnetron discharge and forms a thin film by causing ejected sputtered particles to adhere to a surface of the base material, the magnetron sputtering deposition system further comprising:

the microwave plasma generation apparatus according to claim 4, wherein the microwave plasma generation apparatus radiates ECR plasma between the base material and the target.

11. The magnetron sputtering deposition system according to claim 9, wherein formation of the thin film is performed under a pressure of higher than or equal to 0.05 Pa and lower than or equal to 3 Pa.

12. The magnetron sputtering deposition system according to claim 10, wherein formation of the thin film is performed under a pressure of higher than or equal to 0.05 Pa and lower than or equal to 3 Pa.

13. The microwave plasma generation apparatus according to claim 1, wherein the slot antenna is made of aluminum, a stainless steel, or a brass.

14. The microwave plasma generation apparatus according to claim 1, wherein the single dielectric portion is made of quartz or aluminum oxide.

* * * * *